United States Patent
Wang

(10) Patent No.: US 11,217,645 B2
(45) Date of Patent: Jan. 4, 2022

(54) FLEXIBLE DISPLAY PANEL HAVING A PIXEL UNIT CORRESPONDING TO A BENDABLE AREA ELECTRICALLY CONNECTED TO A PORTION OF A FIRST THIN FILM TRANSISTOR CORRESPONDING TO AN UNBENDABLE REGION

(71) Applicant: WUHAN CHINA STAR OPTOELECTRONICS SEMICONDUCTOR DISPLAY TECHNOLOGY CO., LTD., Hubei (CN)

(72) Inventor: Wei Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 379 days.

(21) Appl. No.: 16/466,651

(22) PCT Filed: Nov. 22, 2018

(86) PCT No.: PCT/CN2018/116860
§ 371 (c)(1),
(2) Date: Jun. 5, 2019

(87) PCT Pub. No.: WO2020/073439
PCT Pub. Date: Apr. 16, 2020

(65) Prior Publication Data
US 2021/0343814 A1 Nov. 4, 2021

(30) Foreign Application Priority Data
Oct. 11, 2018 (CN) .......................... 201811185922.9

(51) Int. Cl.
*H01L 29/08* (2006.01)
*H01L 27/32* (2006.01)
*H01L 51/52* (2006.01)

(52) U.S. Cl.
CPC ...... *H01L 27/3262* (2013.01); *H01L 51/5253* (2013.01); *H01L 2251/5338* (2013.01)

(58) Field of Classification Search
CPC ............. H01L 27/3262; H01L 27/3223; H01L 51/0097; H01L 51/5253; H01L 2251/5338
See application file for complete search history.

(56) References Cited

U.S. PATENT DOCUMENTS 9,760,125 B2 * 9/2017 Kim .................... H01L 51/0097
10,468,475 B2 * 11/2019 Cai .......................... G09G 3/20
(Continued)

FOREIGN PATENT DOCUMENTS

CN 107204357 A 9/2017
CN 107293570 A 10/2017

*Primary Examiner* — Phuc T Dang
(74) *Attorney, Agent, or Firm* — Soroker Agmon Nordman

(57) ABSTRACT

A flexible display panel is provided, comprising: a substrate provided with a bendable region and an unbendable region; a pixel control array layer corresponding to the unbendable region; a flexible layer corresponding to the bendable region; and a pixel unit; the pixel unit corresponding to the bendable region is connected to the first thin film transistor in the pixel control array layer; alternatively, a pixel control array unit is provided at intervals in the flexible layer, the pixel unit corresponding to the bendable region is connected to the second thin film transistor in the pixel control array unit.

18 Claims, 1 Drawing Sheet

(56) References Cited

U.S. PATENT DOCUMENTS

| | | | |
|---|---|---|---|
| 10,672,853 B2* | 6/2020 | Ha | ............... H05K 1/147 |
| 10,818,855 B2* | 10/2020 | Li | ............... B32B 37/12 |
| 2015/0115253 A1 | 4/2015 | Ha et al. | |
| 2018/0040680 A1 | 2/2018 | Cai | |
| 2019/0013486 A1 | 1/2019 | Li et al. | |

* cited by examiner

FLEXIBLE DISPLAY PANEL HAVING A PIXEL UNIT CORRESPONDING TO A BENDABLE AREA ELECTRICALLY CONNECTED TO A PORTION OF A FIRST THIN FILM TRANSISTOR CORRESPONDING TO AN UNBENDABLE REGION

FIELD OF INVENTION

The present application relates to a field of display technology, and in particular, to a flexible display panel.

BACKGROUND OF INVENTION

The basic structure of the folded display screen includes a flexible substrate, a pixel control array layer, an organic light emitting element, and an encapsulation layer. The pixel control array layer is an inorganic film layer-stacked structure, the pixel control array layer is an electrical component (such as thin film transistor, capacitor) formed by electrically connecting a patterned inorganic film and a metal film and functions to control pixel light emission.

The pixel control array layer is a thick inorganic film layer-stacked structure. A major problem limiting the folding display technology is the issue of cracking and peeling of the inorganic film layer under bending stress. Since the bendable portion of the foldable display is in a straight state during operation, and in a bent state when closed, the folded portion will be subjected to repeated bending stresses under the effect of frequent opening and closing of the display module. As mentioned above, the inorganic pixel control array layer is prone to cracking, and under the repeated stress, the crack is gradually expanded to influence other regions of the display.

Therefore, the prior art has drawbacks and need to be improved.

SUMMARY OF INVENTION

The present application provides a flexible display panel, which can enhance the flexibility, thereby, prolong the product life of the display panel, and avoid damage of the device due to cracking and falling off of the inorganic film layer under repeated bending stresses.

To solve these above problems, the technical solution provided by the present application is described as follows: The invention provides a flexible display panel, including: a substrate including a bendable region and an unbendable region disposed on both sides of the bendable region; a pixel control array layer corresponding to the unbendable region disposed on the substrate, the pixel control array layer includes a plurality of first thin film transistors distributed in a manner of an array; a flexible layer corresponding to the bendable region disposed on the substrate; a plurality of pixel units disposed on the pixel control array layer and the flexible layer, the pixel units are arranged at equal intervals on the bendable region and the unbendable region.

The pixel units corresponding to the bendable region are electrically connected to a portion of the first thin film transistors corresponding to the unbendable region; alternatively, a plurality of pixel control array units are provided at intervals in the flexible layer, the pixel control array units include at least one second thin film transistor, the pixel unit corresponding to the bendable region is electrically connected to the second thin film transistor.

In the flexible display panel of the present application, the first pixel unit corresponding to the unbendable region and the second pixel unit corresponding to the bendable region both are used to display images.

In the flexible display panel of the present application, a distribution density of the first thin film transistors corresponding to the unbendable region is greater than a distribution density of the first pixel units.

In the flexible display panel of the present application, the first pixel units are connected to a portion of the first thin film transistors in one-to-one correspondence, the second pixel units each is connected to the remaining first thin film transistors in one-to-one correspondence by an extended signal wire.

In the flexible display panel of the present application, the first thin film transistors for connecting the second pixel units are distributed on a side of the unbendable region close to the bendable region.

In the flexible display panel of the present application, a distribution density of the second thin film transistors corresponding to the bendable region is equal to a distribution density of the second pixel units, one of the pixel control array unit includes one second thin film transistor and is correspondingly connected to one second pixel unit.

In the flexible display panel of the present application, a distribution density of the second thin film transistors corresponding to the bendable region is smaller than a distribution density of the second pixel units.

In the flexible display panel of the present application, one of the pixel control array units includes at least two of the second thin film transistors, and at least two of the second thin film transistors are respectively connected to their corresponding second pixel units in one-to-one correspondence.

In the flexible display panel of the present application, a portion of the second pixel units are connected to the second thin film transistors, and the remaining second pixel units are respectively connected to a portion of the first thin film transistors in one-to-one correspondence.

To solve the above problems, the present application further provides a flexible display panel, including: a substrate including a bendable region and an unbendable region on both sides of the bendable region; a pixel control array layer corresponding to the unbendable region disposed on the substrate, the pixel control array layer includes a plurality of first thin film transistors distributed in a manner of an array; a flexible layer corresponding to the bendable region disposed on the substrate; a plurality of pixel units disposed on the pixel control array layer and the flexible layer; wherein the pixel units corresponding to the bendable regions are electrically connected to a portion of the first thin film transistors corresponding to the unbendable region; alternatively, a plurality of pixel control array units are provided at intervals in the flexible layer, the pixel control array units include at least one second thin film transistor, and the pixel unit corresponding to the bendable region is electrically connected to the second thin film transistor.

In the flexible display panel of the present application, the first pixel unit corresponding to the unbendable region and the second pixel unit corresponding to the bendable region both are used to display images.

In the flexible display panel of the present application, a distribution density of the first thin film transistors corresponding to the unbendable region is greater than a distribution density of the first pixel units.

In the flexible display panel of the present application, the first pixel units are connected to a portion of the first thin film transistors in one-to-one correspondence, the second pixel units each is connected to the remaining first thin film transistors in one-to-one correspondence by an extended signal wire.

In the flexible display panel of the present application, the first thin film transistors for connecting the second pixel units are distributed on a side of the unbendable region close to the bendable region.

In the flexible display panel of the present application, a distribution density of the second thin film transistors corresponding to the bendable region is equal to a distribution density of the second pixel units, one of the pixel control array unit includes one second thin film transistor and is correspondingly connected to one second pixel unit.

In the flexible display panel of the present application, a distribution density of the second thin film transistors corresponding to the bendable region is smaller than a distribution density of the second pixel units.

In the flexible display panel of the present application, one of the pixel control array units includes at least two of the second thin film transistors, and at least two of the second thin film transistors are respectively connected to their corresponding second pixel units in one-to-one correspondence.

In the flexible display panel of the present application, a portion of the second pixel units are connected to the second thin film transistors, and the remaining second pixel units are respectively connected to a portion of the first thin film transistors in one-to-one correspondence.

Compared to the conventional flexible display panels, the flexible display panel provided by the present application does not dispose an inorganic pixel control array layer in the bendable region but fill an organic flexible layer therein, the pixel units corresponding to the bendable region are connected to the thin film transistors disposed on both sides of the unbendable region by the extended metal wires, thereby avoiding repeated bending to cause cracks in the inorganic pixel control array layer and preventing the device from damaging.

Alternatively, a separate island-shaped pixel control array unit is disposed on the bendable region, and a flexible layer is filled between the adjacent pixel control array units, thereby avoiding repeated folding to cause cracks in the inorganic film layer, and preventing the device from damaging.

DESCRIPTION OF DRAWINGS

In order to more clearly illustrate the technical solutions in the embodiments of the present invention, the following figures described in the embodiments will be briefly introduced. It is obvious that the drawings described below are merely some embodiments of the present invention, other drawings can also be obtained by the person ordinary skilled in the field based on these drawings without doing any creative activity.

DETAILED DESCRIPTION OF PREFERRED EMBODIMENTS

Figure 1:
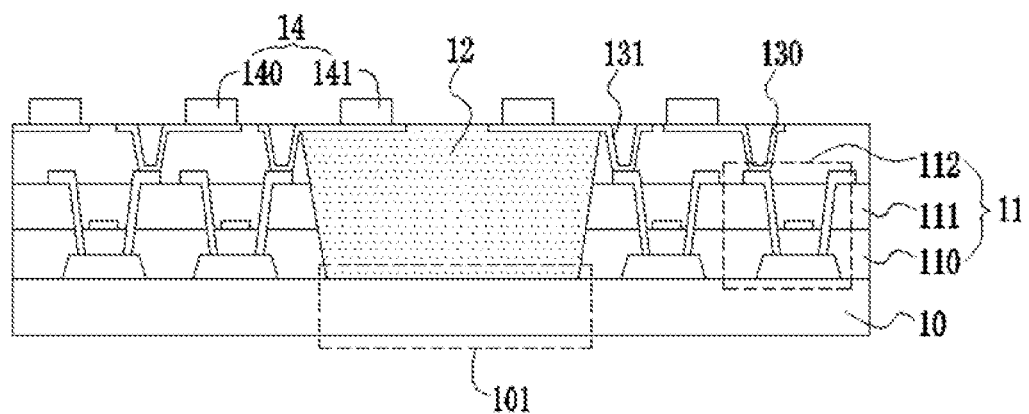
FIG. 1 is a schematic structural diagram of a first flexible display panel according to an embodiment of the present application.

The following description of the embodiment is provided to illustrate the specific embodiment of the invention. The directional terms mentioned in the present invention, such as "on," "below", "front", "behind", "left", "right", "inside", "outside", "side", etc., are merely references of the direction in the drawings. Therefore, the directional terminology used is for the purpose of illustration and understanding of the invention rather than limiting the invention. In the drawings, the structurally similar elements are denoted by the same reference numerals.

The present application is directed to a flexible display panel of the prior art, wherein the pixel control array layer is a thick inorganic film layer-stacked structure, cracking and falling off of the inorganic film layer are easily occurred under repeated bending stress, thereby affecting the performance of the display panel. This embodiment can solve the drawbacks.

FIG. 1 is a schematic structural diagram of a first flexible display panel provided by an embodiment of the present application. The flexible display panel includes: a substrate 10 including a bendable region 101 and an unbendable region on both sides of the bendable region 101; a pixel control array layer 11 disposed on the substrate 10 corresponding to the unbendable region, the pixel control array layer 11 includes a stacked disposed gate insulating layer 110, an interlayer insulating layer 111, and a plurality of first thin film transistors 112 distributed in an array; the flexible layer 12 disposed on the substrate 10 corresponding to the bendable region 101; the pixel unit 14 disposed on the pixel control array layer 11 and the flexible layer 12 in a manner of an array.

The pixel unit 14 includes a first pixel unit 140 corresponding to the unbendable region and a second pixel unit 141 corresponding to the bendable region 101, and the first pixel unit 140 and the second pixel unit 141 both are used to display images. The pixel units 14 are arranged at equal intervals on the bendable region 101 and the unbendable region.

A distribution density of the first thin film transistors 112 corresponding to the unbendable region is greater than a distribution density of the first pixel units 140. That is, in the unbendable region, the distance between two adjacent first pixel units 140 is greater than the distance between two adjacent first thin film transistors 112; the first pixel unit 140 corresponding to the unbendable region is electrically connected to the first thin film transistor 112 in one-to-one correspondence by the first signal wire 130; the second pixel unit 141 corresponding to the bendable region 101 is electrically connected to the first thin film transistor 112 corresponding to the remaining portion of the unbendable region by a second signal wire 131; wherein the length of the second signal wire 131 is greater than the length of the first signal wire 130.

Preferably, the first thin film transistors 112 for connecting the second pixel units 141 are distributed on a side of the unbendable region close to the bendable region 101.

Since the bendable region 101 is not provided with the pixel control array layer 11, but is filled with the flexible layer 12, the flexibility of the bendable region 101 is increased. The second pixel units 141 corresponding to the bendable region 101 are electrically connected to the remaining first thin film transistors 112 of the unbendable region by the extended second signal wires 131, thereby, the pixel arrangement of the bendable region 101 is not affected, and the device is not damaged due to repeated stresses of the bendable region 101.

Figure 2:
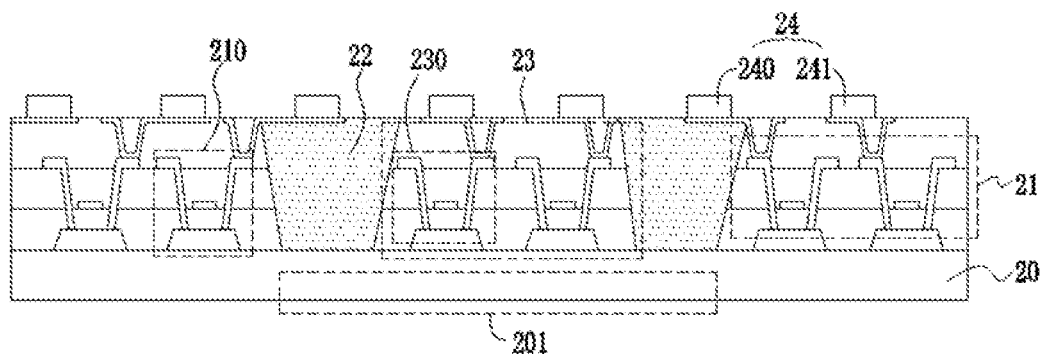
FIG. 2 is a schematic structural diagram of a second flexible display panel according to an embodiment of the present application.

FIG. 2 is a schematic structural diagram of a second flexible display panel provided by an embodiment of the present application.

The flexible display panel includes a substrate 20 including a bendable region 201 and an unbendable region on both sides of the bendable region 201; a pixel control array layer 21 corresponding to the unbendable region disposed on the substrate 20, the pixel control array layer 21 includes a plurality of first thin film transistors 210 distributed in a manner of an array; a flexible layer 22 disposed on the substrate 20 corresponding to the bendable region 201; the flexible layer 22 is provided with pixel control array units 23 arranged at intervals, the pixel control array unit 23 includes at least one second thin film transistor 230; a pixel units 24 disposed on the pixel control array layer 21 and the flexible layer 22 in a manner of an array; the pixel unit 24 includes a first pixel unit 241 corresponding to the unbendable region and a second pixel unit 240 corresponding to the bendable region 201; wherein the pixel control array units 23 distributed at intervals in the bendable region 201, and the adjacent two pixel control array units 23 are separated by the flexible layer 22. The pixel control array unit 23 may include only one second thin film transistor 230, or may include a plurality of second thin film transistors 230.

The distribution density of the first thin film transistor 210 corresponding to the unbendable region is greater than the distribution density of the first pixel unit 241, the first pixel unit 241 is connected to a portion of the first thin film transistor 210 in one-to-one correspondence by the signal wires; the distribution density of the second thin film transistor 230 corresponding to the bendable region 201 is smaller than the distribution density of the second pixel unit 240, a portion of the second pixel unit 240 is connected to the second thin film transistor 230 in one-to-one correspondence, the remaining second pixel units 240 each is connected to the remaining first thin film transistors 210 in one-to-one correspondence by an extended signal wire.

Alternatively, the distribution density of the second thin film transistors 230 corresponding to the bendable region 201 is equal to the distribution density of the second pixel units 240. The pixel control array unit 23 includes one second thin film transistor 230, and one second thin film transistor 230 is correspondingly connected to the second pixel unit 240. The flexible layer 22 is filled between two adjacent pixel control array units 23.

Preferably, the pixel control array unit 23 includes a plurality of the second thin film transistors 230, and the plurality of second thin film transistors 230 are respectively connected to the plurality of the second pixel units 240 in one-to-one correspondence. The distribution density of the second thin film transistors 230 in the pixel control array unit 23 may be increased to reduce the number of the pixel control array units 23, thereby, the bendable region 201 can be filled with a greater amount of the flexible layer 22 to increase the flexibility of the bendable region 201.

In this embodiment, the pixel control array unit 23 is provided with an interval in the bendable region 201, the signal connection of the second pixel unit 240 is ensured, and since the pixel control array unit 23 is an island-shaped separate structure, the flexibility of the bendable region 201 is also increased. In addition, the risk of damaging the device due to repeated stresses on the bendable region 101 is greatly reduced.

The flexible display panel provided by the present application does not dispose an inorganic pixel control array layer in the bendable region but fill an organic flexible layer therein, the pixel units corresponding to the bendable region are connected to the thin film transistors disposed on both sides of the unbendable region by the extended metal wires, thereby avoiding repeated bending causes cracks in the inorganic pixel control array layer and preventing the device from damaging. Alternatively, a separate island-shaped pixel control array unit is disposed on the bendable region, and a flexible layer is filled between the adjacent pixel control array units, thereby avoiding repeated folding causes cracks in the inorganic film layer, and preventing the device from damaging.

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

What is claimed is:

1. A flexible display panel comprising:
    a substrate including a bendable region and an unbendable region disposed on both sides of the bendable region;
    a pixel control array layer corresponding to the unbendable region disposed on the substrate, the pixel control array layer includes a plurality of first thin film transistors distributed in a manner of an array;
    a flexible layer corresponding to the bendable region disposed on the substrate;
    a plurality of pixel units disposed on the pixel control array layer and the flexible layer, the plurality of pixel units being arranged at equal intervals on the bendable region and the unbendable region;
    wherein the plurality of pixel units corresponding to the bendable region being electrically connected to a portion of the first thin film transistors corresponding to the unbendable region;
    alternatively, a plurality of pixel control array units being provided at intervals in the flexible layer, the plurality of pixel control array units include at least one second thin film transistor, one of the plurality of the pixel units corresponding to the bendable region being electrically connected to the second thin film transistor.

2. The flexible display panel according to claim 1, wherein a first pixel unit corresponding to the unbendable region and a second pixel unit corresponding to the bendable region both are used to display images.

3. The flexible display panel according to claim 2, wherein a distribution density of the first thin film transistors corresponding to the unbendable region is greater than a distribution density of the first pixel units.

4. The flexible display panel according to claim 3, wherein the first pixel units are connected to a portion of the first thin film transistors in one-to-one correspondence, the second pixel units each is connected to the remaining first thin film transistors in one-to-one correspondence by an extended signal wire.

5. The flexible display panel according to claim 4, wherein the first thin film transistors for connecting the second pixel units are distributed on a side of the unbendable region close to the bendable region.

6. The flexible display panel according to claim 2, wherein a distribution density of the second thin film transistors corresponding to the bendable region is equal to a distribution density of the second pixel units, one of the pixel control array units includes one second thin film transistor and is correspondingly connected to one second pixel unit.

7. The flexible display panel according to claim 2, wherein a distribution density of the second thin film transistors corresponding to the bendable region is smaller than a distribution density of the second pixel units.

8. The flexible display panel according to claim 7, wherein one of the plurality of pixel control array units includes at least two of the second thin film transistors, and at least two of the second thin film transistors are respectively connected to their corresponding second pixel units in one-to-one correspondence.

9. The flexible display panel according to claim 7, wherein a portion of the second pixel units are connected to the second thin film transistors, and the remaining second pixel units are respectively connected to a portion of the first thin film transistors in one-to-one correspondence.

10. A flexible display panel comprising:
a substrate including a bendable region and an unbendable region on both sides of the bendable region;
a pixel control array layer corresponding to the unbendable region disposed on the substrate, the pixel control array layer includes a plurality of first thin film transistors distributed in a manner of an array;
a flexible layer corresponding to the bendable region disposed on the substrate;
a plurality of pixel units disposed on the pixel control array layer and the flexible layer;
wherein the plurality of pixel units corresponding to the bendable region being electrically connected to a portion of the first thin film transistors corresponding to the unbendable region;
alternatively, a plurality of pixel control array units being provided at intervals in the flexible layer, the plurality of pixel control array units include at least one second thin film transistor, and one of the plurality of pixel units corresponding to the bendable region being electrically connected to the second thin film transistor.

11. The flexible display panel according to claim 10, wherein a first pixel unit corresponding to the unbendable region and a second pixel unit corresponding to the bendable region both are used to display images.

12. The flexible display panel according to claim 11, wherein a distribution density of the first thin film transistors corresponding to the unbendable region is greater than a distribution density of the first pixel units.

13. The flexible display panel according to claim 12, wherein the first pixel units are connected to a portion of the first thin film transistors in one-to-one correspondence, the second pixel units each is connected to the remaining first thin film transistors in one-to-one correspondence by an extended signal wire.

14. The flexible display panel according to claim 13, wherein the first thin film transistors for connecting the second pixel units are distributed on a side of the unbendable region close to the bendable region.

15. The flexible display panel according to claim 11, wherein a distribution density of the second thin film transistors corresponding to the bendable region is equal to a distribution density of the second pixel units, one of the pixel control array units includes one second thin film transistor and is correspondingly connected to one second pixel unit.

16. The flexible display panel according to claim 11, wherein a distribution density of the second thin film transistors corresponding to the bendable region is smaller than a distribution density of the second pixel units.

17. The flexible display panel according to claim 16, wherein one of the plurality of pixel control array units includes at least two of the second thin film transistors, and at least two of the second thin film transistors are respectively connected to their corresponding second pixel units in one-to-one correspondence.

18. The flexible display panel according to claim 16, wherein a portion of the second pixel units are connected to the second thin film transistors, and the remaining second pixel units are respectively connected to a portion of the first thin film transistors in one-to-one correspondence.

* * * * *